US008928151B2

(12) United States Patent
Roy et al.

(10) Patent No.: US 8,928,151 B2
(45) Date of Patent: Jan. 6, 2015

(54) HYBRID CORE THROUGH HOLES AND VIAS

(71) Applicant: Intel Corporation, Santa Clara, CA (US)

(72) Inventors: Mihir K. Roy, Chandler, AZ (US); Islam Salama, Chandler, AZ (US); Yonggang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/019,759

(22) Filed: Sep. 6, 2013

(65) Prior Publication Data
US 2014/0008760 A1 Jan. 9, 2014

Related U.S. Application Data

(62) Division of application No. 12/964,457, filed on Dec. 9, 2010, now Pat. No. 8,552,564.

(51) Int. Cl.
H01L 23/48 (2006.01)
H01L 23/498 (2006.01)

(52) U.S. Cl.
CPC ..... H01L 23/49827 (2013.01); H01L 23/49383 (2013.01); H01L 23/49822 (2013.01); H01L 2924/0002 (2013.01)
USPC ................... 257/774; 257/531; 257/E23.151; 257/E21.476; 438/667

(58) Field of Classification Search
None
See application file for complete search history.

(56) References Cited

FOREIGN PATENT DOCUMENTS

| JP | 2000-165046 A | 6/2000 |
| JP | 2005-191559 A | 7/2005 |
| JP | 2007-150111 A | 6/2007 |
| JP | 2008-270532 A | 11/2008 |
| WO | 2012/078335 A2 | 6/2012 |
| WO | 2012/078335 A3 | 8/2012 |

OTHER PUBLICATIONS

International Search Report and Written Opinion Received for PCT Patent Application No. PCT/US2011/061239, Mailed on Jun. 26, 2012, 10 pages.
International Preliminary Report on Patentability and Written Opinion received for PCT Patent Application No. PCT/US2011/061239, mailed on Jun. 20, 2013, 6 pages.
Office Action received for Korean Patent Application No. 10-2013-7014781, mailed on Apr. 23, 2014, 4 pages of English Translation only.

Primary Examiner — Sonya D McCall Shepard
(74) Attorney, Agent, or Firm — Winkle, PLLC

(57) ABSTRACT

A semiconductor device substrate includes a front section and back section that are laminated cores disposed on a front- and back surfaces of a first core. The first core has a cylindrical plated through hole that has been metal plated and filled with air-core material. The front- and back sections have laser-drilled tapered vias that are filled with conductive material and that are coupled to the plated through hole. The back section includes an integral inductor coil that communicates to the front section. The first core and the laminated-cores form a hybrid-core semiconductor device substrate with an integral inductor coil.

14 Claims, 7 Drawing Sheets

HYBRID CORE THROUGH HOLES AND VIAS

RELATED APPLICATION

The present application is a divisional of U.S. patent application Ser. No. 12/964,457, filed on Dec. 9, 2010, entitled "HYBRID-CORE THROUGH HOLES AND VIAS" which is hereby incorporated herein by reference in its entirety and for all purposes.

Disclosed embodiments relate to semiconductor device substrates and processes of coupling them to semiconductor devices.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Figure 1A:
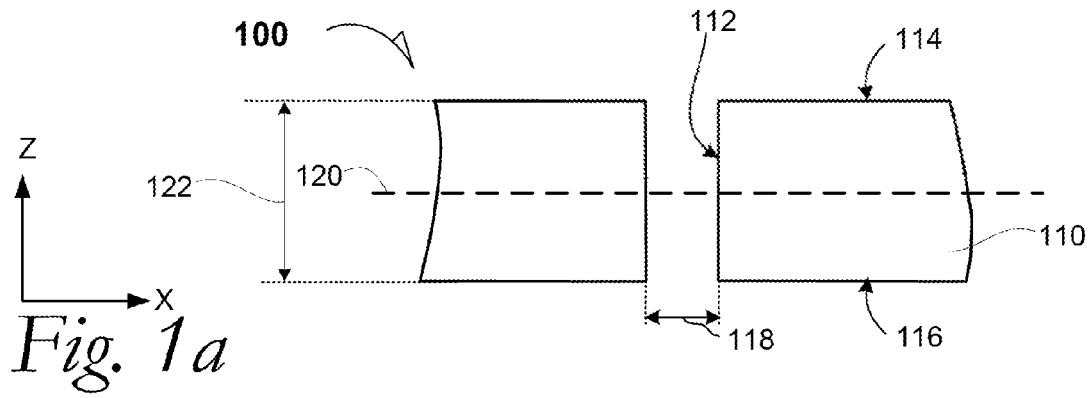
FIG. 1a is a cross-section elevation of a semiconductor device substrate during processing according to an example embodiment.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

FIG. 1 a is a cross-section elevation of a semiconductor device substrate 100 during processing according to an example embodiment. The semiconductor device substrate 100 has been processed with a first core 110 being bored with a through hole 112 that communicates from a front first surface 114 to a back first surface 116. The first core 110 as a whole has a thickness 122 in a range from 400 µm to 700 µm according to an embodiment where the finished apparatus is used as part of a server blade. In an embodiment, the through hole 112 has been bored with a mechanical drill such that the through hole 112 has a substantially right cylindrical form factor with the width 118 and the thickness 122 embodiments acting as dimensional descriptions. In an embodiment, the through hole 112 has been formed by a laser drilling process such that the form factor may be tapered. As depicted, the through hole 112 has a right cylindrical form factor.

In an embodiment, the first core 110 is a prepreg material such as a woven glass and epoxy (FR4) material. Other structures may be used for the first core 110 according to a given application.

The through hole 112 may have a width 118 in a range from 80 micrometer (µm) to 200 µm. In an embodiment, the through hole 112 has a width in a range from 100 µm to 120 µm. The first core 110 is bisected orthogonal to the Z-direction with a symmetry line 120 that lies in a plane of X-Y directions (Y being into and out of the plane of the FIG).

Figure 1B:
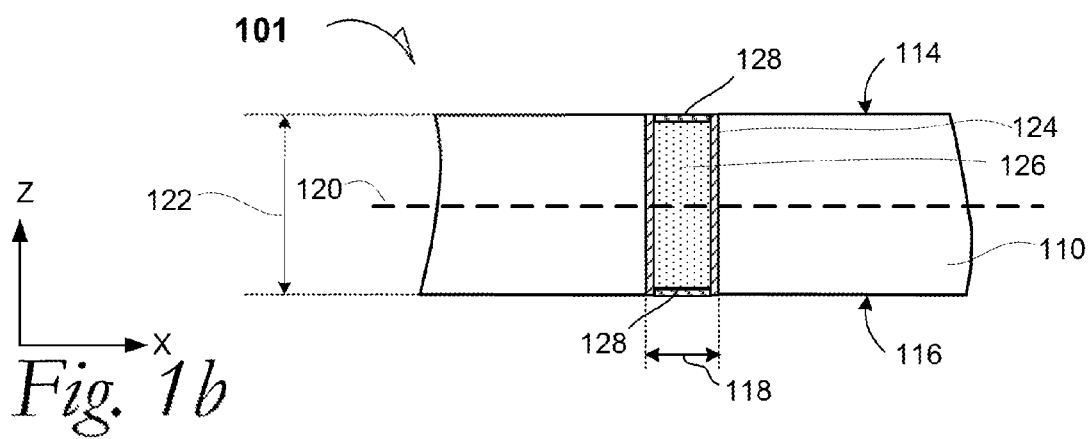
FIG. 1b is a cross-section elevation of the semiconductor device substrate depicted in FIG. 1a after further processing according to an embodiment.

FIG. 1b is a cross-section elevation of the semiconductor device substrate depicted in FIG. 1a after further processing according to an embodiment. The semiconductor device substrate 101 has been processed to form a through hole plating 124 on the through hole walls such that a plated through hole (PTH) is formed. Formation of the PTH 124 is carried out by an electroless plating process according to an embodiment. After formation of the PTH 124, the front surface 114 and the back surface 116 are polished to remove any plating that is not within the form factor of the PTH 124.

In an embodiment, the PTH 124 is a copper metal. In an embodiment, an electroless copper plating technique is used to form the PTH 124 is that carried out by use of a copper solution using ethylenediaminetetraacetic acid (EDTA) at a pH of 13 and a temperature of 50° C. that uses cytosine as a stabilizer. In an example embodiment fast electroless plating is carried out by a copper solution using EDTA at a pH of 13 and a temperature of 50° C. that uses benzotriazole as a stabilizer. In an example embodiment fast electroless plating is carried out by a copper solution using EDTA at a pH of 13 and a temperature of 50° C. that uses 2-mercaptobenzothiazole as a stabilizer.

The PTH 124 has been filled with a filler 126 such as an epoxy material with a low or zero magnetic quality. As such, the filler 126 when it is non-magnetic, may be referred to as an "air core" filler 126. Formation of the filler 126 may be done by forcing fluent filler material 126 into the PTH 124, curing, and planarizing the front surface 114 and back surface 116 to remove any extraneous filler material that is not inside the form factor of the PTH 124. In an embodiment, the filler 126 is a bulk organic material with a particulate inorganic filler. In an embodiment, the filler 126 is a epoxy bulk material with a silica particulate filler. Other materials may be used for bulk filler and the particulate filler.

After the filler 126 has been installed, the PTH 124 is further processed with a PTH cap 128 such as by electroplating that uses the PTH 124 as a cathode. Thereafter, further polishing and planarizing is done to remove any extraneous electrically conductive material of the PTH cap 128 that is outside the form factor of the PTH 124. In an embodiment, plating of the PTH 124 is electrolessly formed copper and the PTH cap 128 is electroplated copper. The entire structure within the form factor of the PTH 124, including the filler 126 and the PTH cap 128 may hereinafter be referred to as the PTH 124 unless explicitly otherwise articulated.

Figure 1C:
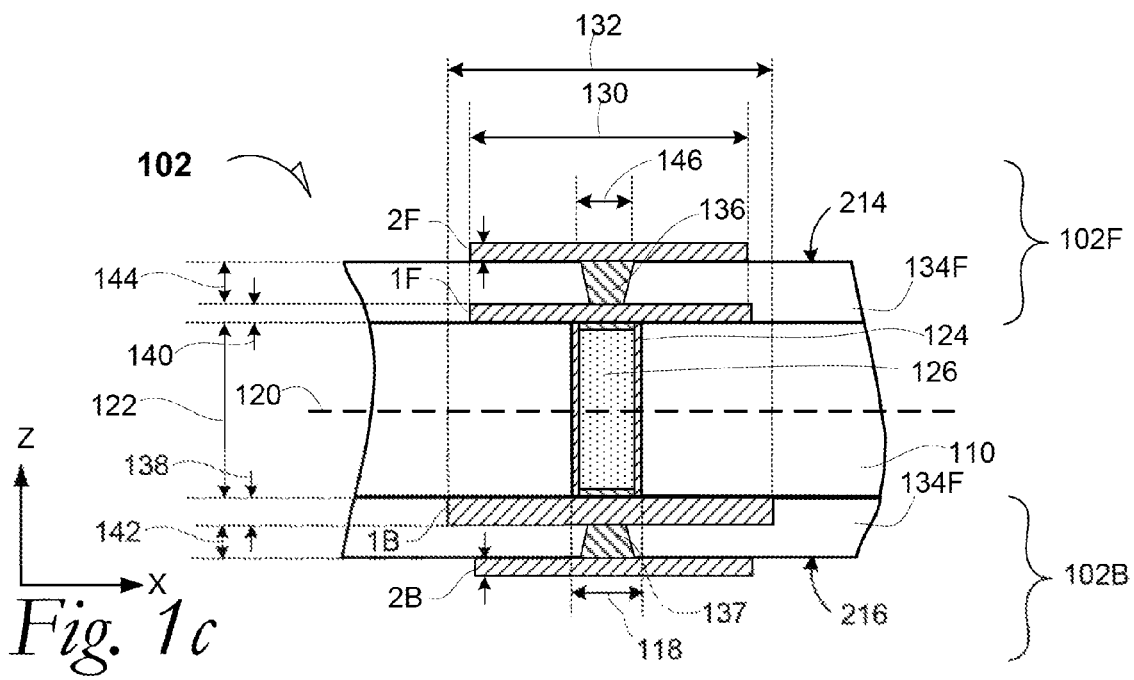
FIG. 1c is a cross-section elevation of the first semiconductor device substrate depicted in FIG. 1b after further processing according to an embodiment.

FIG. 1c is a cross-section elevation of the semiconductor device substrate depicted in FIG. 1b after further processing according to an embodiment. The semiconductor device substrate 102 has been processed by subtractive patterning of metal films to form a front first through hole conductive pad 1F that is in contact with the PTH 124 at the first side 114 (see FIG. 1b), as well as a back first through hole conductive pad 1B that is in contact with the PTH 124 at the second side 116. Hereinafter, the front first through hole conductive pad 1F will be referred to as the front first pad 1F. Hereinafter, the back first through hole conductive pad 1B will be referred to as the back first pad 1B. The front first pad 1F can be seen to have a front dimension 130 in the X direction and the back first pad 1B can be seen to have a back dimension 132 that is different from the front first pad 1F. The back first pad 1B is part of an inductor coil structure as will be further illustrated. The back first pad 1B also may be thicker than other through hole conductive pads as illustrated.

The semiconductor device substrate 102 may be referred to by sections as a front board section 102F and a back board section 102B. The front board section 100F typically will be closer to semiconductor devices such as server-type processors, and the back board section 100B will typically be closer to a motherboard such as a blade motherboard, to power sources, and power-source connections such as AC power sources. The back board section 102B will include an integral inductor coil for use with a server processor that will be mounted above the front board section 102F according to an embodiment.

Further processing includes the formation of a second core 134 (including a front second core 134F and a back second core 134B) that is located both as part of the front board section 102F and the back board section 102B. The second core 134 may be referred to as a laminated second core 134. The second core 134 may be referred to as a laminated-core substrate 134. The second core 134 may be formed by spinning on a fluent material, curing, planarizing, and repeating for each of the front and back sections. Thereafter, a laser-drilling technique is used to form through holes that mate generally within or at least partially within a vertical projection (in the Z directions) of the form factor of the PTH 124. As illustrated, a front first tapered contact 136 has a tapered form factor as the second core 134 was laser drilled. Formation of the front first tapered contact 136 as well as the back first tapered contact 137 is done by electroplating such as copper, followed by planarizing to achieve a front second surface 214 and a back second surface 216. The front first tapered contact 136 has a top width 146 that is within or at least partially within the Z-direction projection (through hole width 118) of the PTH 124. Some offset may occur during processing, which may be useful according to given design rules, but electrical-connection continuity is maintained by the presence of the front first conductive pad 1F.

Vertical spacing of layers for the semiconductor device substrate 102 includes both thickness of the conductive pads and thickness of the second core 134. In an embodiment, the back first back conductive pad 1B has a thickness 138 in a range from 30 μm to 70 μm. In an embodiment, the back first conductive pad 1B has a thickness 138 of 35 μm. In an embodiment, the front first conductive pad 1F has a thickness 140 in a range from 30 μm to 70 μm. In an embodiment, the front first conductive pad 1F has a thickness 140 of 35 μm.

The thickness (in the Z direction) of the second core 134 is measured as that portion that is in addition to the thickness of the conductive pads. In an embodiment, each of the front second core 134F and the back second core 134B has an additional thickness 142 and 144, respectively, in a range from 50-100 μm. In an embodiment, each of the front second core 134F and the back second core 134B has an additional thickness 142 and 144, respectively, in a range from 60-75 μm.

Further processing includes forming a front second tapered contact conductive pad 2F as well as a back second tapered contact conductive pad 2B. Herein after, the front second tapered contact conductive pad 2F will be referred to as a front second pad 2F and the back second tapered contact conductive pad 2B will be referred to as a back second pad 2B. The thicknesses of these tapered contact conductive pads may be the same ranges of those of the front and back first through hole conductive pads 1F and 1B, respectively, as set forth in this disclosure.

Figure 1D:
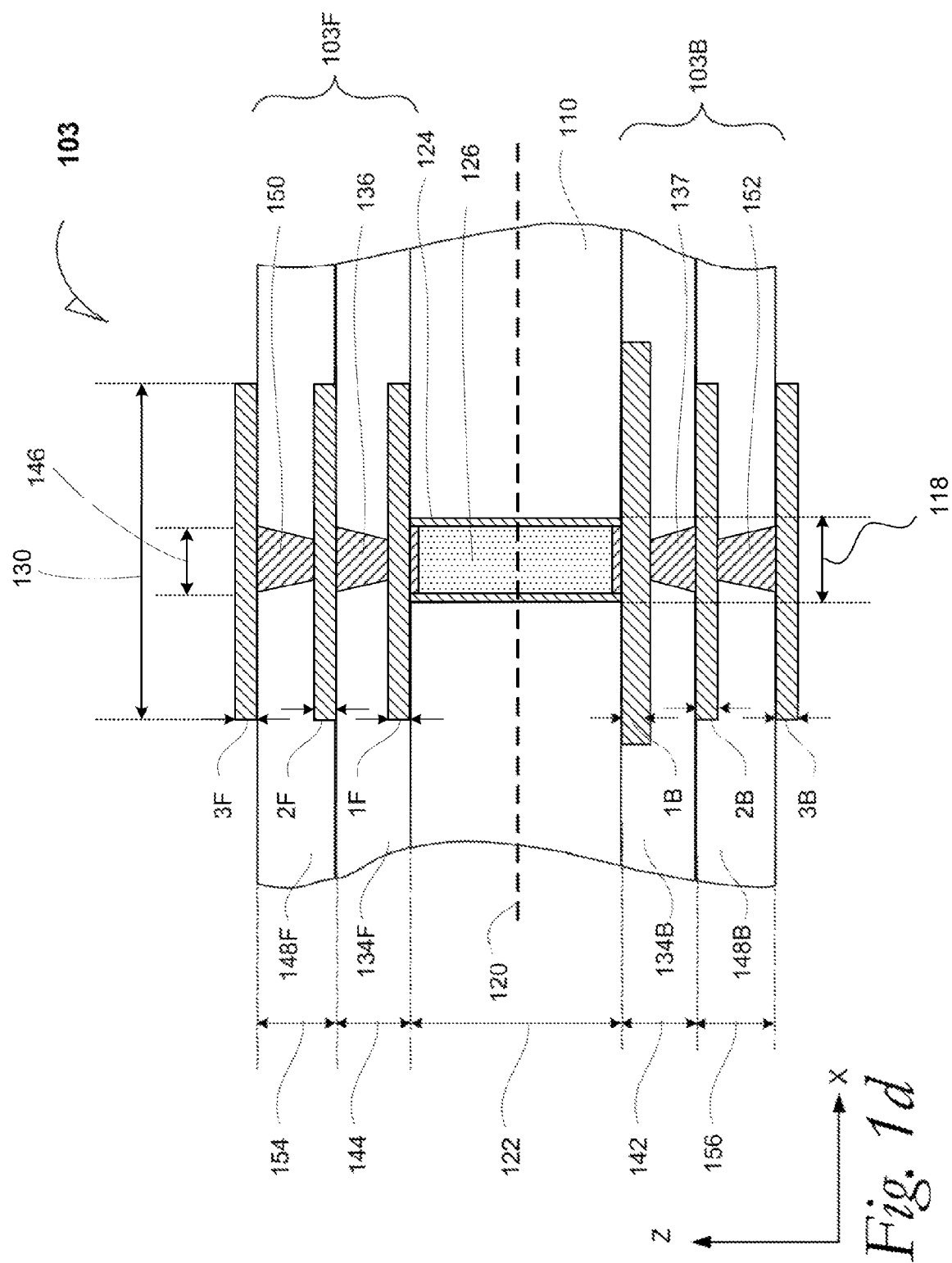
FIG. 1d is a cross-section elevation of the semiconductor device substrate depicted in FIG. 1c after further processing according to an embodiment.

FIG. 1d is a cross-section elevation of the semiconductor device substrate depicted in FIG. 1c after further processing according to an embodiment. The semiconductor device substrate 103 may be referred to by sections as a front board section 103F and a back board section 103B. The semiconductor device substrate 103 may be referred to as an inductor-containing semiconductor device substrate 103. It can be seen that the back board section 103B is an enhanced back board section 102B as seen in FIG. 1c. Similarly, it can be seen that the front board section 103F is an enhanced front board section 102B. As a whole, the semiconductor device substrate 103 may be referred to as a hybrid-core semiconductor device substrate 103.

The semiconductor device substrate 103 has been processed with a subsequent core 148 that includes a subsequent front core 148F and a subsequent back core 148B. The subsequent core 148 may be referred to as a laminated subsequent core 148. As a whole, the front board section 103F and the back board section 103B may be referred to as a laminated-core substrate that is laminated onto the first core 110.

Processing also includes laser drilling subsequent vias that are laminated-core through holes. The laminated-core through holes are filled with a respective front subsequent tapered contact 150 and a back subsequent tapered contact 152. Further processing also includes subtractive-process formation of a front subsequent through hole conductive pad 3F and a back subsequent through hole conductive pad 3B. Hereinafter, the front subsequent through hole conductive pad 3F will be referred to as the front subsequent pad 3F and the back subsequent through hole conductive pad 3B will be referred to as the back subsequent pad 3B.

It may now be understood that more than two laminated-core layers may be fabricated on the first core layer 110 to form a laminated-core substrate depending upon a given application utility. In an example embodiment, front- and back second core layers are fabricated between the respective front- and back first and subsequent core layers. Nomenclature uses "subsequent" as the last laminated-core layer such that in this embodiment, first, second, and subsequent laminated-core layers amount to three on the front board section 103F and three on the back board section 103B. In an embodiment, the number of laminated-core layers is between one and five for each of the front board section 103F and the back board section 103B. In an embodiment, the number of laminated-core layers is between six and 10 for each of the front board section 103F and the back board section 103B.

Overall thickness of semiconductor device substrate 103 may range from about 850 μm to 1,400 μm. In an embodiment, each through hole conductive pad has a thickness of 35 μm and each laminated-core layer adds additional height of 60 μm such that along with the first core layer 110 at 400 μm thickness, totals a thickness of 650 μm for the semiconductor device substrate 103. In an embodiment, each through hole conductive pad has a thickness of 35 μm, each laminated-core layer adds an additional height of 60 μm such that along with the first core layer 110 at 700 μm, totals a thickness of 950 μm. In an embodiment, each through hole conductive pad has a thickness of 35 μm, each laminated-core layer adds an additional height of 75 μm such that along with the first core layer 110 at 400 μm, totals a thickness of 910 μm. In an embodiment, each through hole conductive pad has a thickness of 35 μm, each laminated-core layer adds an additional height of 75 μm such that along with the first core layer 110 at 700 μm, totals a thickness of 1,210 μm. In an embodiment, a five-each laminated-core layer substrate has a total thickness of 1,400 μm.

It can be seen that the semiconductor device substrate 103 includes three laminated layers. It may be appreciated the semiconductor device substrate 103 may be referred to as two laminated-core layers 134F and 134B, two laminated-core layers 148F and 148B, and a first core layer 110. It is useful to refer to each core layer as a laminated layer in connection with any other layer.

Figure 2:
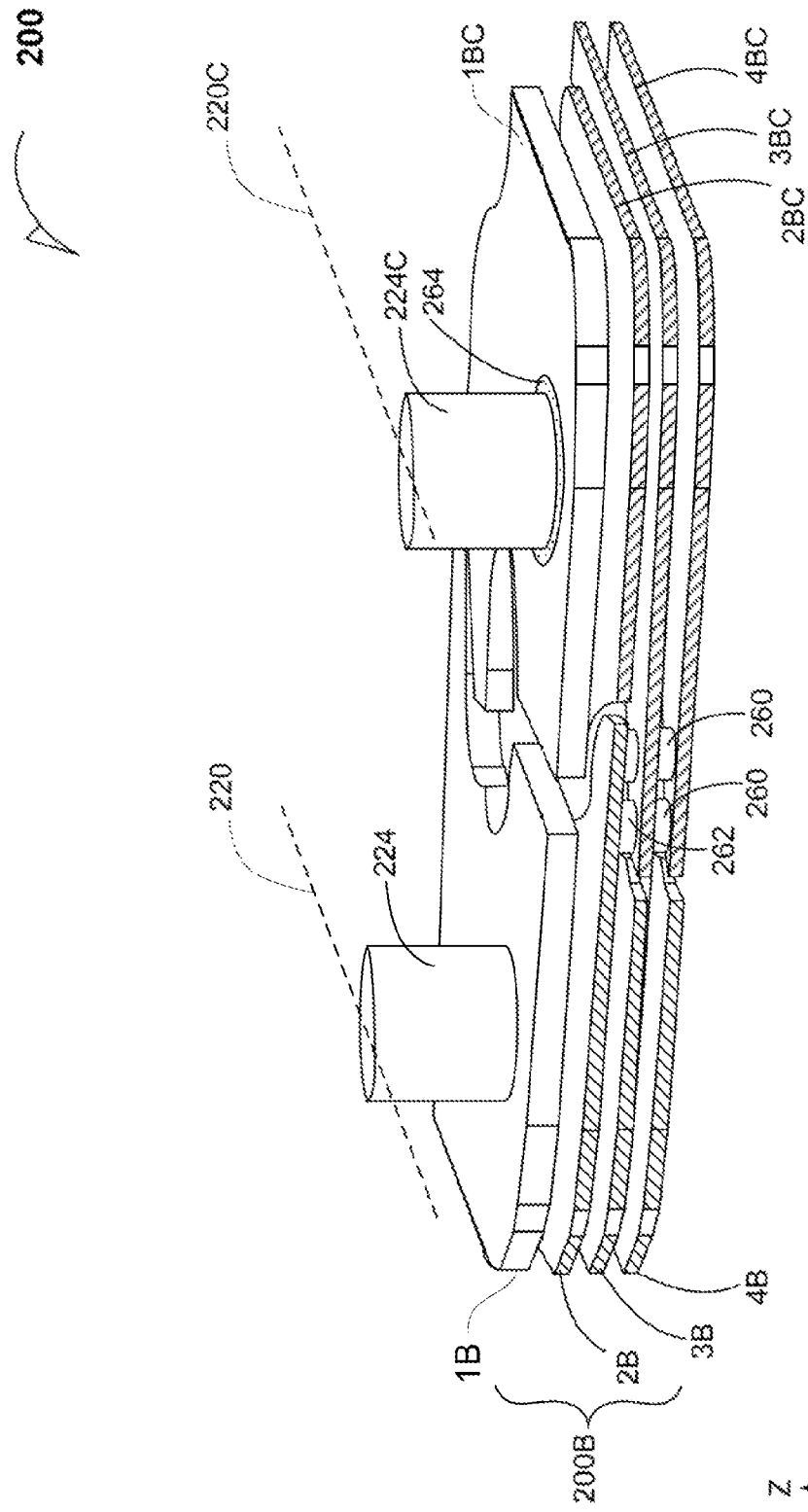
FIG. 2 is a perspective elevation of a portion of a semiconductor device substrate according to an example embodiment.

FIG. 2 is a perspective elevation of a portion of a semiconductor device substrate 200 according to an example embodiment. The semiconductor device substrate 200 may be referred to as an inductor-containing semiconductor device substrate 200. The semiconductor device substrate 200 represents back structures similar in location to the back board section 103B is depicted below the symmetry line 120 depicted in FIG. 1d; an analogous symmetry line 220 is depicted. The symmetry line 220 refers to a symmetrical amount of PTH 224 below and above the line 220. It can be seen that the PTH 224 is a coupling that communicates inductor-altered current from the integral inductor coil.

A PTH 224 is assembled to a back first through hole conductive pad 1B ("back first pad 1B). Not seen but present are a back first tapered contact similar to the back first tapered contact 138 depicted in FIG. 1d, as well as a back second filled via similar in position to the back subsequent tapered contact 152, also seen in FIG. 1d. The back first tapered contact is substantially directly below the projected form factor of the PTH 224 and the back first tapered contact makes electrical contact between the back first pad 1B and a back second pad 2B. The back second filled via makes electrical contact between the back second pad 2B and a back third pad 3B.

A back third filled via is present that is similar to the back second filled via and the back first tapered contact. The back third filled via is not pictured but it makes electrical contact between the back third pad 3B and a back subsequent pad 4B. It can be seen that in the illustrated embodiment, the back subsequent pad 4B is a fourth through hole conductive pad 4B and it is depicted in this embodiment as the bottom, or in this embodiment, last conductive pad in the semiconductor device substrate 200.

A complementary structure is depicted as part of the semiconductor device substrate 200, which includes a complementary PTH 224C as well as a complementary symmetry line 220C that is at the same level as the symmetry line 220. The complementary PTH 224C is assembled to a complementary back first through hole conductive pad 1BC ("complementary back first pad 1BC"). Not seen but present are a complementary back first tapered contact similar to the back first tapered contact 138 depicted in FIG. 1d, as well as a complementary back second filled via similar in position to the back subsequent tapered contact 152. The complementary back first tapered contact makes electrical contact between the complementary back pad 1BC and a complementary back second pad 2BC. The complementary back second filled via makes electrical contact between the complementary back second pad 2BC and a complementary back third pad 3BC.

A complementary back third filled via is not pictured but it makes electrical contact between the complementary back third pad 3BC and a complementary back subsequent pad 4BC. It can be seen that in the illustrated embodiment, the complementary back subsequent pad 4BC is a complementary fourth pad 4BC and it is depicted in this embodiment as the complementary bottom conductive pad 4BC in the semiconductor device substrate 200. In an embodiment, connector vias 260 and 262, seen in the foreground, are used. Connector vias may also be used at the semiconductor device substrate 200 behind or in the background, which is obscured in the FIG.

An inductive coil is established in the semiconductor device by using only the complementary back first pad 1BC and the back first pad 1B. An inductive effect is established by allowing current to pass first through the complementary back first pad 1BC and then to the back first pad 1B. Finally after an inductive effect has been established, current passes up the PTH 224 toward a processor that is mounted above the front board section (not pictured).

In an embodiment, an inductive coil is established in the semiconductor device substrate 200 by using each of the several through hole conductive pads because they each have a simulated crescent shape. Induction is established by allowing current to flow between conductive- and complementary conductive pads such that current may first flow in the X-Y plane through successive complementary- and original pads in a helical coil current flow, followed by second flowing up a PTH to approach a front board section and ultimately to supply power or signal to a die such as a server-blade processor.

In an embodiment, the inductive coil may be formed by first current passing into the complementary back subsequent pad 4BC. Behind the semiconductor device substrate 200, an electrical connection exists between the complementary subsequent back pad 4BC to the subsequent back pad 4B. Current jumps up one level and crosses to the complementary back third pad 3BC. Behind the semiconductor device substrate 200, an electrical connection exists between the complementary back third pad 3BC and the back third pad 3B. Current jumps up one level and crosses to the complementary back second pad 2BC. Behind the semiconductor device substrate 200, an electrical connection exists between the complementary back second pad 2BC and the back second pad 2B. Current jumps up one level and crosses to the complementary back first pad 1BC. Behind the semiconductor device substrate 200, an electrical connection exists between the complementary back first pad 1BC and the back first pad 1B. Behind the back first through hole conductive pad 1B, the electrical current passes in the Z-direction into the PTH 224 where it crosses the symmetry line 220 to a front structure similar in location to a front board section such as the front board section 102F that is depicted in FIG. 1d. It can be seen that an insulating ring 264 electrically isolates the complementary PTH 224C from the several complementary conductive pads. Accordingly, the power or signal current uses at least two of the conductive pads to generate an inductive effect before passing through the PTH 224.

It may now be appreciated that the quality of the inductor that is needed may be altered by the number of coils as well as the particular overall shape of the inductor. A single coil is just the complementary back first pad 1BC and the first pad 1B. A double coil may be the complementary back second pad 2BC, the back second pad 2B, the complementary back first pad 1BC and the first pad 1B.

In an example embodiment, conductive pads are shunted together to multiply current flow but maintain a given useful vertical (Z-direction) form factor. This embodiment of shunted conductive pads is seen in particular in FIG. 2, where the complementary back subsequent- and third pads 4BC and 3BC, respectively are shunted together by connector vias 260. In this embodiment, current begins in parallel in the back subsequent pad 4B and back third pad 3B, flows clockwise (in the X-Y plane) to the complementary back subsequent- and third pads 4BC and 3BC. Connector vias 262 allow current to jump up to the back second pad 2B where it may continue to circle the semiconductor device substrate 200 in the back board section 200B to create a useful inductive effect. Connector vias 260 and 262 may be fabricated at the same time a given laser-drilled through hole is formed.

It can be seen that the semiconductor device substrate 200 includes three laminated layers not including the first core layer.

After current that has been subjected to a useful inductive effect, it crosses the symmetry line 220 through one of the PTH 224 and the complementary PTH 224C. As seen the insulator ring 264 is to prevent current from passing up the complementary PTH 224C. From the PTH 224, current passes to a front board section where the current may be split into several leads that feed a plurality of dice such as Intel® Xeon® processors that are mounted above the front board section of the semiconductor device substrate 200. Other processors may be employed where useful.

Figure 3:
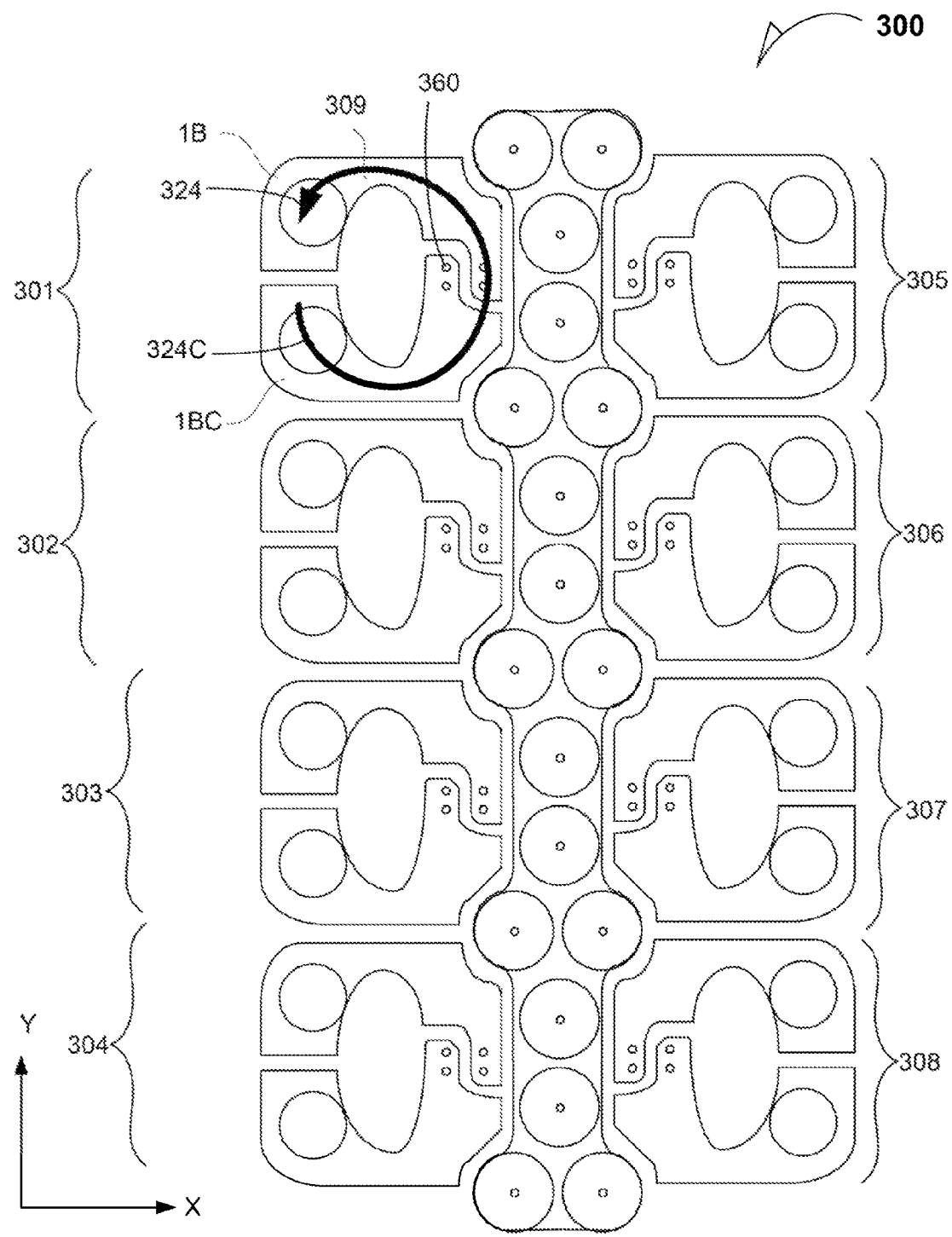
FIG. 3 is a top plan of a portion of a semiconductor device substrate according to an example embodiment.

FIG. 3 is a top plan of a portion of a semiconductor device substrate 300 according to an example embodiment. The semiconductor device substrate 300 may be referred to as an integral inductor-coil semiconductor device substrate 300. Each of the several through hole conductive pads has a simulated crescent shape. The semiconductor device substrate 300 is part of a back board section analogous to other disclosed embodiments. The semiconductor device substrate 300 exhibits a plurality of structures including a first coil 301 through an eight coil 308. The first coil 301 includes a first back tapered-contact conductive pad 1B ("back first pad 1B") and a complementary first back tapered-contact conductive pad 1BC ("complementary back first pad 1BC"). The semiconductor device substrate 300 also exhibits a PTH 234 and a complementary PTH 324C. Where an inductive effect is useful in to supply to a front board section of the semiconductor device substrate 300 current may have been routed through the complementary back first pad 1BC, crossed to the back first pad 1B by a connector via 360, and then passed vertically (orthogonal to the plane of the FIG) to a front board section. A visual inspection of proportions indicate a substantially circular path for current flow (seen by the curved arrow 309) around the complementary first pad 1BC and the first pad 1BC, respectively, according to an embodiment. It may be understood that an eccentric current flow may be established depending upon a given configuration of the original- and complementary pads.

Figure 4:
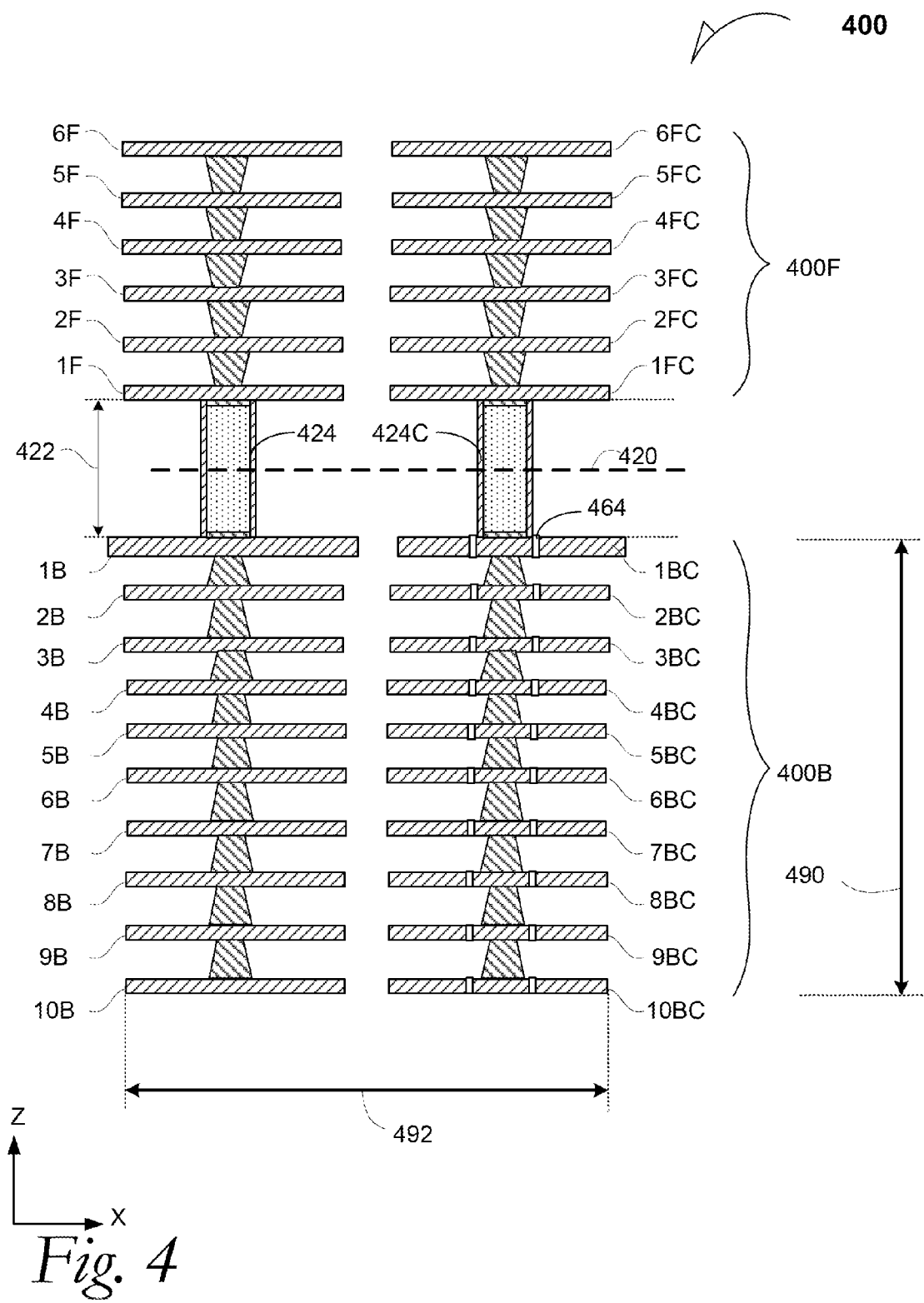
FIG. 4 is a cross-section elevation of selected features of a semiconductor device substrate according to an example embodiment.

FIG. 4 is a cross-section elevation of selected features of a semiconductor device substrate 400 according to an example embodiment. The semiconductor device substrate 400 may be referred to as an integral-inductor containing semiconductor device substrate 400. As a whole, the semiconductor device substrate 400 may be referred to as a hybrid-core semiconductor device substrate 400.

Not shown are the first core that would fill the thickness 422. Similarly not shown are the several laminated-cores that would fill gaps between the several tapered-contact conductive pads. As seen, the semiconductor device substrate 400 has both an original structure and a complementary structure. The thickness 422 of the first core may be in a range from 400 μm to 700 μm. Where the inductor exits the back pads at the first back pad 1B, insulating rings 464 electrically isolate the complementary PTH 424C as well as the complementary tapered contacts from the several complementary conductive pads.

The front board section 400F is depicted with a total of six front through hole conductive pads, 1F, 2F, 3F, 4F, 5F, and 6F where the front sixth pad 6F may also be referred to as a front subsequent pad 6F. Similar terminology may be ascribed to the front complementary structure of the front board section 400F, which has a total of six complementary front through hole conductive pads, 1FC, 2FC, 3FC, 4FC, 5FC, and 6FC where the complementary front sixth pad 6FC may also be referred to as a complementary front subsequent pad 6FC.

The back board section 400B is depicted with a total of 10 back through hole conductive pads, 1B, 2B, 3B, 4B, 5B, 6B, 7B, 8B, 9B, and 10B where the back $10^{th}$ pad 10B may also be referred to as a back subsequent pad 10B. Similar terminology may be ascribed to the front complementary structure of the back board section 400B, which has a total of 10 complementary back through hole conductive pads, 1BC, 2BC, 3BC, 4BC, 5BC, 6BC, 7BC, 8BC, 9BC, and 10BC where the complementary back $10^{th}$ pad 10BC may also be referred to as a complementary back subsequent pad 10BC.

It may now be understood that a number of front pads may be different from the number of back pads. Where a useful stiffness of a given semiconductor device substrate is required and an integral inductor coil is needed with a given number of coil turns, more conductive pads may be in one of the front section than in the back section or vice versa. Similarly, where a useful stiffness of a given semiconductor device substrate is required and an integral coil inductor is needed with a given number of coil turns, the same number of coil pads may each be in the front section as the back section. For example, FIG. 1d may be understood to be an abbreviation of FIG. 4. Consequently, the number of front- and back pads may be equal. It may now be understood that an embodiment includes up to 10 front- and back pads each that may be part of the semiconductor device substrate 400, but the number of front pads may be more than the number of back pads. It may now be understood that up to 10 front- and back pads each may be part of the semiconductor device substrate 400, but the number of front pads may be less than the number of back pads.

It may now be understood that the total of the original- and complementary back pads may all be coupled singly to form up to a 10-turn inductor coil. It may now be understood that the total of original-and complementary back pads may be shunted to each other to form up to a nine-turn inductor coil. For example, two each original- and complementary back pads may be shunted to each other to form a five-turn inductor coil. It may now be understood that a subset of original- and complementary back pads may be singly arrayed while another subset or original- and complementary back pads may be shunted to each other to form up to an eight-turn inductor coil. For example, FIG. 2 may be understood to be a four-pad structure that is a three-turn inductor coil where the subsequent and third back pads are shunted to each other.

It can be seen that the semiconductor device substrate 400 includes 17 laminated layers. It may be appreciated the semiconductor device substrate 400 may be referred to as six laminated-core layers in the front section 400F, 10 laminated-core layers in the back section 400B, and a first core layer that takes up the thickness 422. It is useful to refer to each core layer as a laminated layer in connection with any other layer.

Other features of the several embodiments include an aspect ratio of back-pad stack height 490 divided by the back-pad breadth 492. In an embodiment, the aspect ratio is less than one. In an embodiment, the aspect ratio is equal to 0.5. In an embodiment, the aspect ratio is equal to one. In an embodiment, the aspect ratio is greater than one. In an embodiment, the aspect ratio is equal to 1.5. In an embodiment, the aspect ratio is 2. In an embodiment, the aspect ratio is greater than 2 such as 3.

Figure 5:
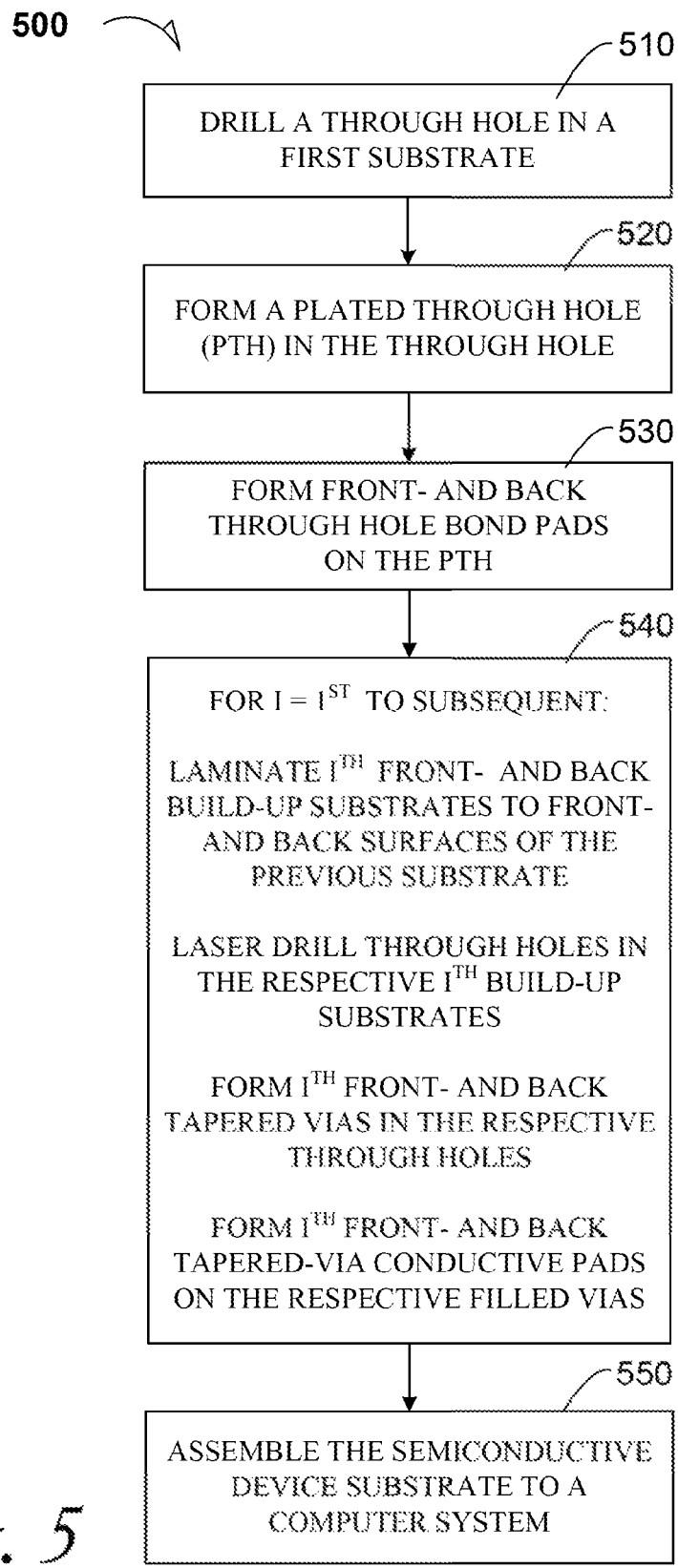
FIG. 5 is a process and method flow diagram according to several embodiments.

FIG. 5 is a process and method flow diagram 500 according to several embodiments.

At 510, the process includes drilling a through hole in a first substrate. In a non-limiting example embodiment, a drill bit with a thickness between 100 μm and 120 μm is used to form the through hole 112 in the first core 110. In an embodiment, the through hole 112 has a thickness of 400 μm. In an embodiment, the through hole 112 has a thickness of 700 μm. In an embodiment, the through hole 112 has a thickness of greater than 400 μm and less than 700 μm.

At 520, the process includes forming a plated through hole. In a non-limiting example embodiment, the PTH 124 is formed of electrolessly plated copper, the filler 126 is formed to make an air core, and the PTH cap 128 is formed of copper by electroplating that uses the PTH 124 as the cathode.

At 530, the process includes forming front- and back through hole bond pads on the PTH. In a non-limiting example embodiment, the front first pad 1F and the back first pad 1B are formed by subtractive plating techniques.

At 540, the laminated-cores are formed. At 540, the process includes an algorithm from one to 10, by way or non-limiting example, to form the laminated-cores. In an example embodiment, the semiconductor device substrate 103 depicted in FIG. 1d is formed at 540 by setting i=1 to 3 where the third iteration is forming the front- and back subsequent pads 3F and 3B, respectively. It may now be understood that formation of the complementary structures is accomplished also simultaneously at 540.

It may now be understood that the algorithm depicted at 540 may include a different i=1 to "subsequent" for the front section compared to the back section.

Processing includes laminating front- and back laminated-core substrates, followed by laser drilling through holes and forming filled vias. Next, processing includes forming front- and back through hole conductive pads on the respective front- and back filled vias.

It may now be understood that at 540, the process includes configuring the number of conductive pads may include shunting some or all of them together. It may also be understood that after a given iteration, the algorithm may be repeated to fabricate additional back structures but not additional front structures.

At 550, a method embodiment includes assembling the semiconductor device substrate to a computer system. In a non-limiting example embodiment, processors are mounted above the front board section 103F of the semiconductor device substrate 103 as illustrated in FIG. 1d. In a non-limiting example embodiment, processors are mounted above the front board section (not pictured) that is coupled to the back board section 200B of the semiconductor device substrate 200 as illustrated in FIG. 2. The semiconductor device substrate 200 is assembled to a server blade that contains a server processor according to an embodiment. In a non-limiting example embodiment, a plurality of processors are mounted above the semiconductor device substrate 300 and at least the pads 1B and 1BC form an integral inductor coil in the back section 200B.

Figure 6:
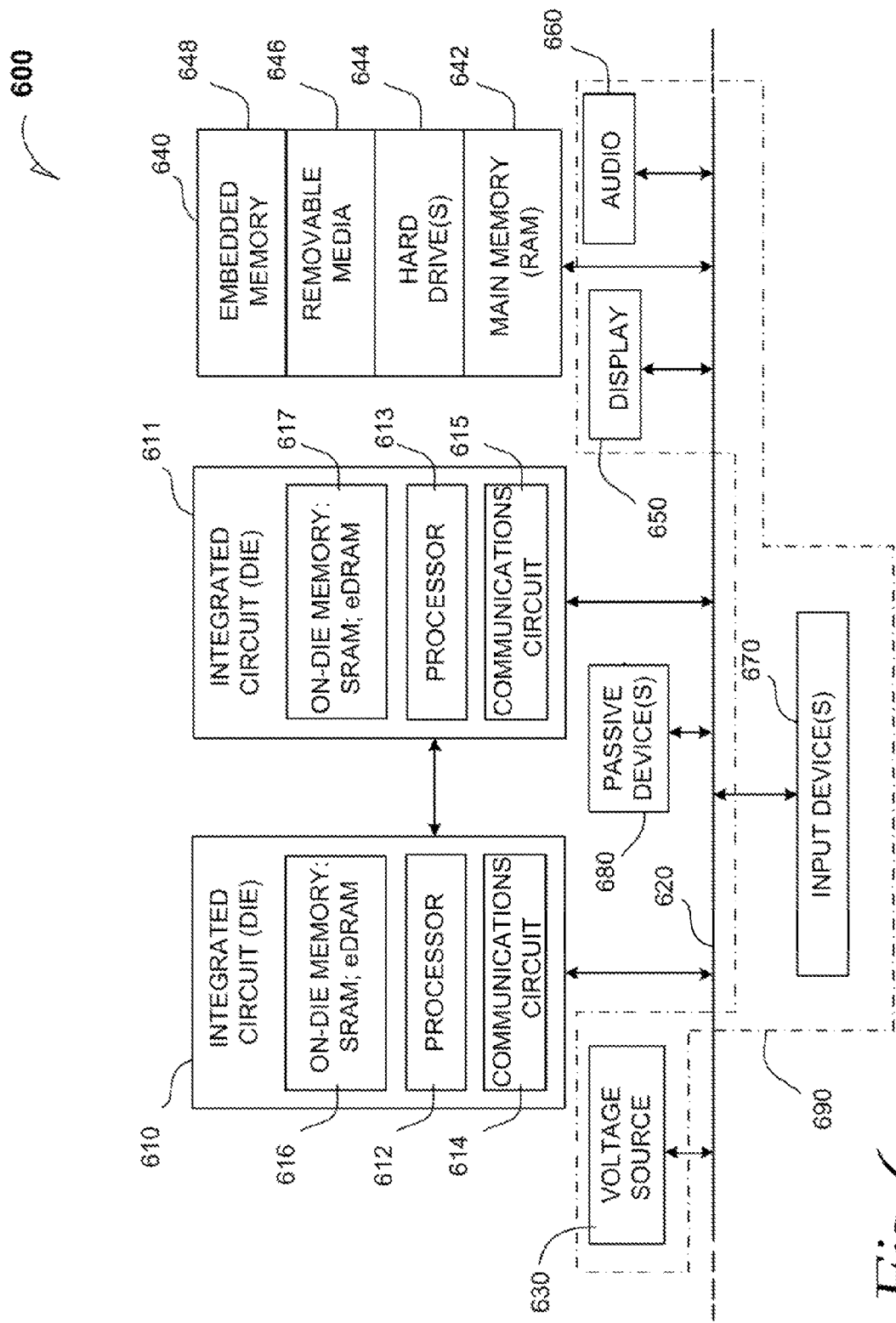
FIG. 6 is a schematic of a computer system according to an embodiment.

FIG. 6 is a schematic of a computer system 600 according to an embodiment. The computer system 600 (also referred to as the electronic system 600) as depicted can embody an inductor-containing semiconductor device substrate according to any of the several disclosed embodiments and their equivalents as set forth in this disclosure. The computer system 600 may be part of—or an accessory to a server blade with an inductor-containing semiconductor device substrate embodiment that is installed in a server farm. The computer system 600 may be a motherboard with the inductor-containing semiconductor device substrate in a multiple-processor device. The computer system 600 may be a desktop computer.

The computer system 600 may be a mobile device such as a netbook computer. The computer system 600 may be a mobile device such as a wireless smart phone. The computer system 600 may be a hand-held reader. The computer system 600 may be integral to an automobile. The computer system 600 may be integral to a television.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems. In an embodiment, the processor 610 includes on-die memory 616 such as static random-access memory (SRAM). In an embodiment, the processor 610 includes embedded on-die memory 616 such as embedded dynamic random-access memory (eDRAM).

In an embodiment, the integrated circuit 610 is complemented with a subsequent integrated circuit 611 such as a subsequent processor on a server blade that is supported by an inductor-containing semiconductor device substrate embodiment in connection with a more generic processor 610. In an embodiment, the integrated circuit 610 is complemented with a subsequent integrated circuit 611 that is coupled to integrated circuit 610. Useful embodiments include a dual processor 613 and a dual communications circuit 615 and dual on-die memory 617 such as SRAM. In an embodiment, the dual integrated circuit 610 includes embedded on-die memory 617 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

The computer system 600 may also include passive devices 680 that are coupled to active devices such as the integrated circuit 610. In an embodiment, the passive device 680 is an inductor that is used for an RF circuit. In an embodiment, the passive device 680 is an inductor-containing semiconductor device substrate embodiment.

A foundation substrate 690 may be part of the computing system 600. In an embodiment, the foundation substrate 690 is a motherboard that holds an inductor-containing semiconductor device substrate embodiment. In an embodiment, the foundation substrate 690 is a board onto which an inductor-containing semiconductor device substrate embodiment is mounted. In an embodiment, the foundation substrate 690 incorporates at least one of the functionalities encompassed within the dashed line 690 and is a substrate such as the user shell of a wireless communicator.

As shown herein, the integrated circuit 610 can be implemented in a number of different embodiments, including an inductor-containing semiconductor device substrate embodiment according to any of the several disclosed embodiments and their equivalents, an electronic system, a computer system, one or more methods of fabricating an inductor-containing semiconductor device substrate embodiment, and one or more methods of fabricating an inductor-containing semiconductor device substrate embodiment according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for an inductor-containing semiconductor device substrate embodiment according to any of the several disclosed inductor-containing semiconductor device substrate embodiments and their equivalents.

Although a die may refer to a processor chip, an RF chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A semiconductor device substrate, comprising:
   a first core with a front surface and a back surface;
   a laminated-core substrate built on the first core front- and back surfaces, wherein the laminated-core substrate includes a front section and a back section, and wherein the back section includes an integral inductor coil;
   wherein the first core includes a plated through hole (PTH) and front- and back PTH conductive pads in contact with the PTH;
   wherein the laminated-core substrate includes a tapered via in each of the front- and back sections that expose the PTH conductive pads and that include front- and back tapered contacts that contact the PTH conductive pad and that each include tapered-via conductive pads coupled to the front- and back tapered vias;
   wherein the first core include a complementary PTH and complementary back first through hole conductive pads; and
   wherein the integral inductor coil consists of a back first through hole conductive pad that has a simulated crescent shape that is in contact with the PTH, and a complementary back first through hole conductive pad that has a simulated crescent shape that is in contact with a complementary PTH.

2. The semiconductor device substrate of claim 1, wherein the front section includes a first plurality of laminated-core layers, wherein the back section includes a second plurality of laminated-core layers, and wherein the first plurality is greater than the second plurality.

3. The semiconductor device substrate of claim 1, further including:
   wherein the front section includes a first plurality of laminated-core layers, wherein the back section includes a second plurality of laminated-core layers, and wherein the first plurality is equal to the second plurality.

4. The semiconductor device substrate of claim 1, further including:
   wherein the front section includes a first plurality of laminated-core layers, wherein the back section includes two laminated-core layers.

5. The semiconductor device substrate of claim 1, further including:
   wherein the front section includes two laminated-core layers, wherein the back section includes two laminated-core layers.

6. The semiconductor device substrate of claim 1, the integral inductor coil has a height-to-breadth aspect ratio of aspect ratio that is greater than one.

7. The semiconductor device substrate of claim 1, wherein the integral inductor coil has a height-to-breadth aspect ratio of aspect ratio that is equal to one.

8. The semiconductor device substrate of claim 1, wherein the integral inductor coil has a height-to-breadth aspect ratio of aspect ratio that is less than one.

9. The semiconductor device substrate of claim 1, wherein the back first through hole conductive pad is part of a back-pad stack, wherein the complementary back first through hole conductive pad is part of a complementary back-pad stack, and wherein the integral inductor coil has a height-to-breadth aspect ratio of aspect ratio that is selected from greater than one, equal to one, and less than one.

10. The semiconductor device substrate of claim 1, wherein the substrate has a height in a range from 650 micrometer (μm) to 1,400 μm.

11. The semiconductor device substrate of claim 1, wherein the first core has a height in a range from 400 μm to 700 μm, and wherein the substrate has a height in a range from 850 μm to 1,210 μm.

12. The semiconductor device substrate of claim 1, wherein the substrate has a height in a range from 850 μm to 1,210 μm.

13. The semiconductor device substrate of claim 1, wherein at least one of the PTH and complimentary PTH is a right cylindrical through hole.

14. The semiconductor device substrate of claim 1, wherein at least one of the PTH and complimentary PTH includes the filler that is a non-magnetic material.

\* \* \* \* \*